(12) United States Patent
Wang et al.

(10) Patent No.: US 11,502,133 B2
(45) Date of Patent: Nov. 15, 2022

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yang Wang, Beijing (CN); Guoqiang Tang, Beijing (CN); Renrong Gai, Beijing (CN); Yangpeng Wang, Beijing (CN)

(73) Assignees: Chengdu BOE Optoelectronics Technology Co., Ltd., Sichuan (CN); Beijing BOE Technology Development Co., Ltd., Beijing (CN)

(*) Notice: Subject to any disclaimer, the term of this patent is extended or adjusted under 35 U.S.C. 154(b) by 266 days.

(21) Appl. No.: 16/759,197

(22) PCT Filed: Apr. 25, 2019

(86) PCT No.: PCT/CN2019/084293
§ 371 (c)(1),
(2) Date: Apr. 24, 2020

(87) PCT Pub. No.: WO2020/215275
PCT Pub. Date: Oct. 29, 2020

(65) Prior Publication Data
US 2021/0233962 A1      Jul. 29, 2021

(51) Int. Cl.
*H01L 27/30* (2006.01)
*H01L 27/28* (2006.01)
(Continued)

(52) U.S. Cl.
CPC .......... *H01L 27/307* (2013.01); *G06F 3/0412* (2013.01); *G06F 3/0443* (2019.05);
(Continued)

(58) Field of Classification Search
CPC ... H01L 27/307; H01L 27/323; G06F 3/0442; G06V 40/1318
See application file for complete search history.

(56) References Cited

U.S. PATENT DOCUMENTS

2010/0007632 A1* 1/2010 Yamazaki ........... H01L 27/3234
345/175
2013/0308073 A1* 11/2013 Yamazaki ........... H01L 27/3227
257/40
(Continued)

FOREIGN PATENT DOCUMENTS

CN        106056099 A      10/2016
CN        106775081 A       5/2017
(Continued)

*Primary Examiner* — Victoria K. Hall
(74) *Attorney, Agent, or Firm* — The Webb Law Firm

(57) ABSTRACT

The present disclosure provides a display panel, a manufacturing method thereof and a display device. The display panel includes a substrate, a pixel structure layer on the substrate, and a sensor layer on a side of the pixel structure layer away from the substrate. The pixel structure layer includes a plurality of sub-pixels. At least one of the plurality of sub-pixels is configured to emit a first light. The sensor layer includes a photoelectric conversion device. The photoelectric conversion device is configured to receive a second light produced after the first light is reflected by an external object, and convert the second light into an electrical signal.

15 Claims, 10 Drawing Sheets

(51) Int. Cl.
  *G06F 3/044* (2006.01)
  *H01L 27/32* (2006.01)
  *G06F 3/041* (2006.01)
  *G06V 40/13* (2022.01)

(52) U.S. Cl.
  CPC .......... *G06F 3/0445* (2019.05); *H01L 27/283* (2013.01); *H01L 27/288* (2013.01); *H01L 27/3234* (2013.01); *G06F 3/0446* (2019.05); *G06F 2203/04103* (2013.01); *G06V 40/1318* (2022.01); *H01L 27/323* (2013.01); *H01L 27/3244* (2013.01)

(56) References Cited

U.S. PATENT DOCUMENTS

| | | | |
|---|---|---|---|
| 2017/0221971 A1 | 8/2017 | Shen et al. | |
| 2018/0053032 A1* | 2/2018 | Ding | G06V 40/1318 |
| 2018/0069068 A1* | 3/2018 | Ka | H01L 51/50 |
| 2018/0074614 A1* | 3/2018 | Hiraga | G06F 3/0445 |
| 2018/0129852 A1* | 5/2018 | Zeng | H01L 27/3234 |
| 2018/0165496 A1* | 6/2018 | Cheng | G06V 40/1329 |
| 2018/0239942 A1 | 8/2018 | Xu et al. | |
| 2019/0013368 A1 | 1/2019 | Chung et al. | |
| 2019/0073071 A1 | 3/2019 | Ryu et al. | |
| 2019/0237522 A1 | 8/2019 | Gao | |
| 2019/0244562 A1* | 8/2019 | Zhu | H01L 51/5221 |
| 2019/0251378 A1* | 8/2019 | Jung | B06B 1/0629 |
| 2021/0233975 A1* | 7/2021 | Bouthinon | G06F 3/0412 |

FOREIGN PATENT DOCUMENTS

| | | |
|---|---|---|
| CN | 108596015 A | 9/2018 |
| CN | 109216421 A | 1/2019 |
| CN | 109378333 A | 2/2019 |

* cited by examiner

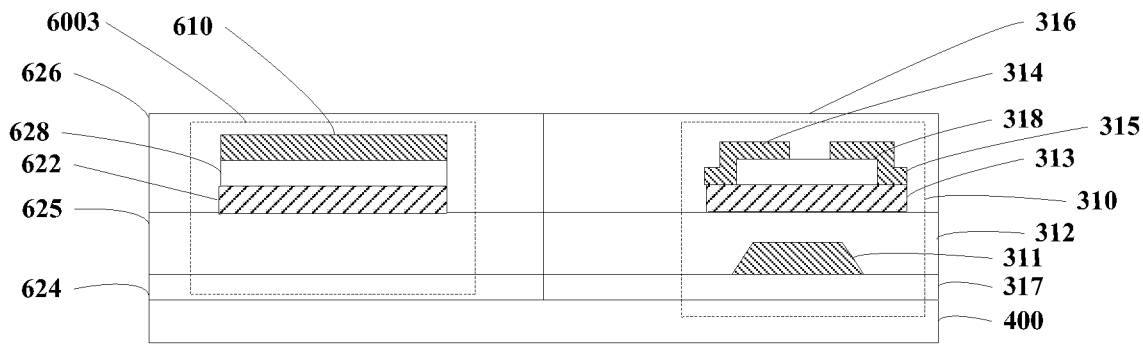
Fig. 8
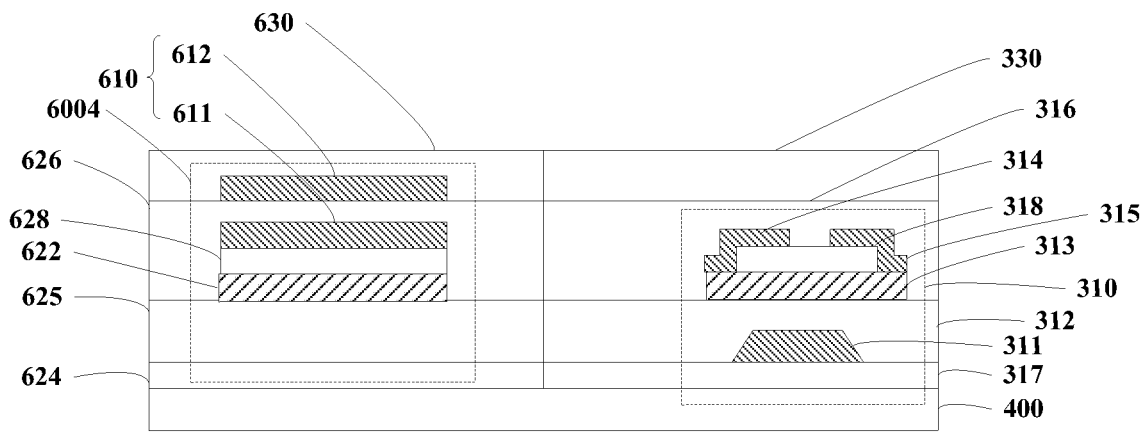
Fig. 9
| Form a pixel structure layer on a substrate, wherein the pixel structure layer comprises a plurality of sub-pixels | ~ S1002 |
↓
| Form a sensor layer on a side of the pixel structure layer away from the substrate, wherein the sensor layer comprises a photoelectric conversion device | ~ S1004 |
Fig. 10

DISPLAY PANEL, MANUFACTURING METHOD THEREOF, AND DISPLAY DEVICE

CROSS-REFERENCE TO RELATED APPLICATION

This application is the United States national phase of International Application No. PCT/CN2019/084293 filed Apr. 25, 2019, the disclosure of which is hereby incorporated by reference in its entirety.

TECHNICAL FIELD

The present disclosure relates to a display panel, a manufacturing method thereof, and a display device.

BACKGROUND

With the development of economy and science and technology, consumer electronic products such as mobile phones are rapidly popularized. At present, products with ultra-high screen ratio or full-screen borderless products will be a future development trend. AMOLED (Active Matrix Organic Light Emitting Diode) display, as a representative of the cutting-edge technology and the high-end products in the display field, will be confronted with technical challenges brought by market demand trend. In addition, an important function of terminals such as mobile phones is a fingerprint recognition function.

SUMMARY

According to an aspect of embodiments of the present disclosure, a display panel is provided. The display panel comprises: a substrate; a pixel structure layer on the substrate, wherein the pixel structure layer comprises a plurality of sub-pixels, at least one of which is configured to emit a first light; and a sensor layer on a side of the pixel structure layer away from the substrate, wherein the sensor layer comprises a photoelectric conversion device configured to receive a second light produced after the first light is reflected by an external object and convert the second light into an electrical signal.

In some embodiments, the pixel structure layer further comprises a pixel defining layer; each of the plurality of sub-pixels comprises a functional layer, wherein functional layers of different sub-pixels are spaced apart by the pixel defining layer; and an orthographic projection of the photoelectric conversion device on the substrate is inside an orthographic projection of the pixel defining layer on the substrate.

In some embodiments, the plurality of sub-pixels comprise a green sub-pixel, and the photoelectric conversion device is above a pixel defining layer adjacent to a functional layer of the green sub-pixel.

In some embodiments, the photoelectric conversion device comprises an organic photoelectric triode, the organic photoelectric triode comprising a thin film transistor and an organic photoelectric structure electrically connected to the thin film transistor.

In some embodiments, the display panel further comprises an encapsulation layer between the sensor layer and the pixel structure layer.

In some embodiments, the thin film transistor comprises: a gate; a first insulating layer covering the gate; a first organic semiconductor layer on the first insulating layer; a first protective layer on the first organic semiconductor layer; a source and a drain each connected to the first organic semiconductor layer, the source covering a portion of the first protective layer and a portion of the first organic semiconductor layer, and the drain covering another portion of the first protective layer and another portion of the first organic semiconductor layer; a second insulating layer between the encapsulation layer and the gate; and a third insulating layer on the source, the drain, and the first protective layer.

In some embodiments, the organic photoelectric structure comprises: a first electrode layer electrically connected to the source or the drain; an organic photoelectric conversion layer on the first electrode layer; and a second protective layer on the organic photoelectric conversion layer.

In some embodiments, the sensor layer further comprises a touch device, the touch device comprising a touch electrode layer above the encapsulation layer, the touch electrode layer comprising a first touch electrode and a second touch electrode spaced apart from the first touch electrode, wherein: the first touch electrode and the second touch electrode are both in the same layer as the gate; or the first touch electrode is in a same layer as the gate, and the second touch electrode is above or below the first touch electrode.

In some embodiments, the sensor layer further comprises a touch device, the touch device comprising a touch electrode layer above the encapsulation layer, the touch electrode layer comprising a first touch electrode and a second touch electrode spaced apart from the first touch electrode, wherein: the first touch electrode and the second touch electrode are both in the same layer as the source and the drain; or the first touch electrode is in the same layer as the source and the drain, and the second touch electrode is above or below the first touch electrode.

In some embodiments, the touch device further comprises: a fourth insulating layer on the encapsulation layer, the fourth insulating layer being in the same layer as the second insulating layer; a fifth insulating layer on the fourth insulating layer, the fifth insulating layer being in the same layer as the first insulating layer; a second organic semiconductor layer on the fifth insulating layer, the second organic semiconductor layer being in the same layer as the first organic semiconductor layer; a third protective layer on the second organic semiconductor layer, the third protective layer being in the same layer as the first protective layer; and a sixth insulating layer covering the third protective layer, the sixth insulating layer being in the same layer as the third insulating layer.

According to another aspect of the present disclosure, a display device is provided. The display device comprises the display panel described above.

According to another aspect of the present disclosure, a manufacturing method of a display panel is provided. The manufacturing method comprises: forming a pixel structure layer on a substrate, wherein the pixel structure layer comprises a plurality of sub-pixels, at least one of which is configured to emit a first light; and forming a sensor layer on a side of the pixel structure layer away from the substrate, wherein the sensor layer comprises a photoelectric conversion device configured to receive a second light produced after the first light is reflected by an external object and convert the second light into an electrical signal.

In some embodiments, the photoelectric conversion device comprises an organic photoelectric triode, the organic photoelectric triode comprising a thin film transistor and an organic photoelectric structure electrically connected to the thin film transistor; the sensor layer further comprises a touch device; and the forming of the sensor layer comprises:

forming the thin film transistor and the organic photoelectric structure of the organic photoelectric triode, and forming the touch device.

In some embodiments, the manufacturing method further comprises: forming an encapsulation layer on the pixel structure layer before forming the sensor layer, wherein the photoelectric conversion device is formed on a side of the encapsulation layer away from the pixel structure layer.

In some embodiments, the forming the thin film transistor of the organic photoelectric triode comprises: forming a second insulating layer on the encapsulation layer; forming agate on the second insulating layer; forming a first insulating layer covering the gate; forming a first organic semiconductor layer on the first insulating layer; forming a first protective layer on the first organic semiconductor layer; forming a source and a drain each connected to the first organic semiconductor layer, the source covering a portion of the first protective layer and a portion of the first organic semiconductor layer, and the drain covering another portion of the first protective layer and another portion of the first organic semiconductor layer; and forming a third insulating layer on the source, the drain, and the first protective layer.

In some embodiments, the forming of the organic photoelectric structure of the organic photoelectric triode comprises: forming a first electrode layer electrically connected to the source or the drain; forming an organic photoelectric conversion layer on the first electrode layer; and forming a second protective layer on the organic photoelectric conversion layer.

In some embodiments, the forming of the touch device comprises: forming a touch electrode layer above the encapsulation layer, the touch electrode layer comprising a first touch electrode and a second touch electrode spaced apart from the first touch electrode wherein: the first touch electrode, the second touch electrode, and the gate are formed by the same patterning process; or the first touch electrode and the gate are formed by the same patterning process, and the second touch electrode is formed above or below the first touch electrode.

In some embodiments, the forming of the touch device comprises: forming a touch electrode layer above the encapsulation layer, the touch electrode layer comprising a first touch electrode and a second touch electrode spaced apart from the first touch electrode, wherein: the first touch electrode, the second touch electrode, the source, and the drain are formed by the same patterning process; or the first touch electrode, the source, and the drain are formed by the same patterning process, and the second touch electrode is formed above or below the first touch electrode.

In some embodiments, the forming of the touch device further comprises: forming a fourth insulating layer on the encapsulation layer, wherein the fourth insulating layer is formed integrally with the second insulating layer; forming a fifth insulating layer on the fourth insulating layer, wherein the fifth insulating layer is formed integrally with the first insulating layer; forming a second organic semiconductor layer on the fifth insulating layer, wherein the second organic semiconductor layer and the first organic semiconductor layer are formed by the same patterning process; forming a third protective layer on the second organic semiconductor layer, wherein the third protective layer and the first protective layer are formed by the same patterning process; and forming a sixth insulating layer covering the third protective layer, wherein the sixth insulating layer is formed integrally with the third insulating layer.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which:

FIG. 8 is a schematic cross-sectional view showing a display panel according to another embodiment of the present disclosure;

FIG. 9 is a schematic cross-sectional view showing a display panel according to another embodiment of the present disclosure;

FIG. 10 is a flowchart showing a manufacturing method of a display panel according to an embodiment of the present disclosure;

Figure 1:
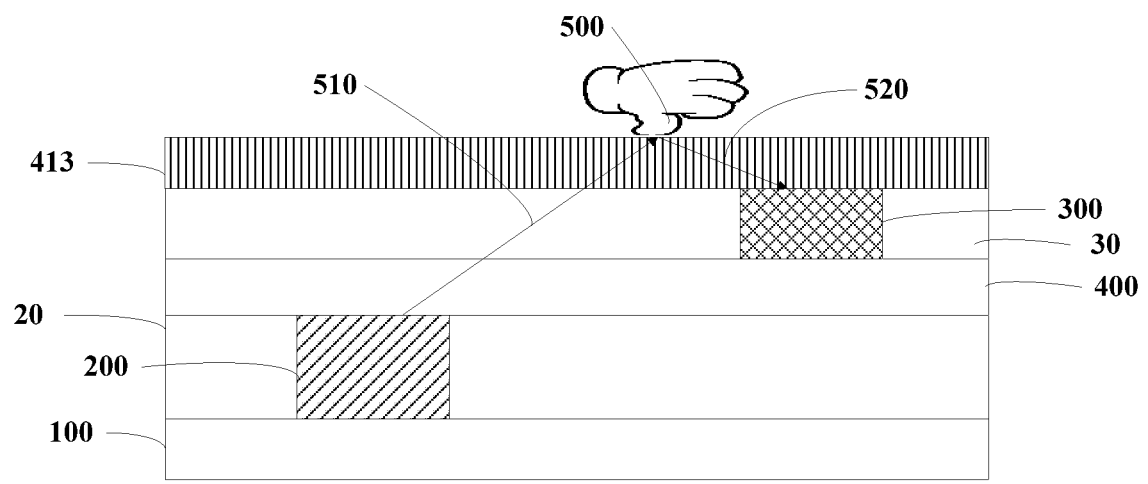
FIG. 1 is a schematic cross-sectional view showing a display panel according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that in the field of AMOLED display, there is already a relatively mature back partial fingerprint recognition technology. In the technology, a fingerprint recognition module is integrated below a display area, thereby achieving the fingerprint recognition function on a back of a display panel. However, with this technology, it is only possible to achieve a partial fingerprint recognition function, but hardly to achieve a large-screen fingerprint recognition function and a full-screen fingerprint recognition function.

In view of this, embodiments of the present disclosure provide a display panel that may achieve a fingerprint recognition function on a light exit side. The display panel according to some embodiments of the present disclosure will be described in detail below in conjunction with the accompanying drawings.

FIG. 1 is a schematic cross-sectional view showing a display panel according to an embodiment of the present disclosure.

As shown in FIG. 1, the display panel comprises a substrate 100, a pixel structure layer 20 on the substrate 100, and a sensor layer 30 on a side of the pixel structure layer 20 away from the substrate 100. The pixel structure layer 20 may comprise a plurality of sub-pixels 200. At least one of the plurality of sub-pixels 200 is configured to emit a first light 510. The sensor layer 30 is above the pixel structure layer 20. The sensor layer 30 comprises a photoelectric conversion device 300. The photoelectric conversion device 300 is configured to receive a second light 520 produced after the first light 510 is reflected by an external object 500 and convert the second light 520 into an electrical signal. The second light 520 is reflected light of the first light 510.

For example, the external object 500 may comprise a fingerprint. The electrical signal generated by the photoelectric conversion device 300 may be transmitted to a processing circuit (not shown). The processing circuit is configured to perform signal processing (e.g., reading and arithmetic processing, etc.) on the electrical signal to obtain fingerprint information. In this way, the fingerprint recognition function is achieved on a light exit surface of the display panel.

So far, a display panel according to some embodiments of the present disclosure has been provided. The display panel comprises a substrate, a pixel structure layer on the substrate, and a sensor layer on a side of the pixel structure layer away from the substrate. The sensor layer comprises a photoelectric conversion device. The photoelectric conversion device is disposed on a light exit side of the display panel. In this way, the first light emitted by a sub-pixel in the pixel structure layer is reflected by an external object (e.g., a fingerprint) to produce a second light, and the photoelectric conversion device receives the second light and converts the second light into an electrical signal (or referred to as generating an electrical signal based on the second light). Relevant information (e.g. fingerprint information) of the external object may be obtained after signal processing is performed on the electrical signal. Since the photoelectric conversion device is disposed on the light exit side of the display panel, a large number of photoelectric conversion devices may be provided in the display panel, which is beneficial to achieve a large-screen or even full-screen fingerprint recognition function.

In some embodiments, as shown in FIG. 1, the display panel may further comprise an encapsulation layer 400 between the sensor layer 30 and the pixel structure layer 20. The photoelectric conversion device 300 is on a side of the encapsulation layer 400 away from the pixel structure layer 20. For example, the photoelectric conversion device 300 is on the encapsulation layer 400.

In some embodiments, as shown in FIG. 1, the display panel may further comprise a cover plate 413 on a side of the sensor layer 30 away from the substrate 100. For example, a material of the cover plate 413 may comprise glass.

Figure 2:
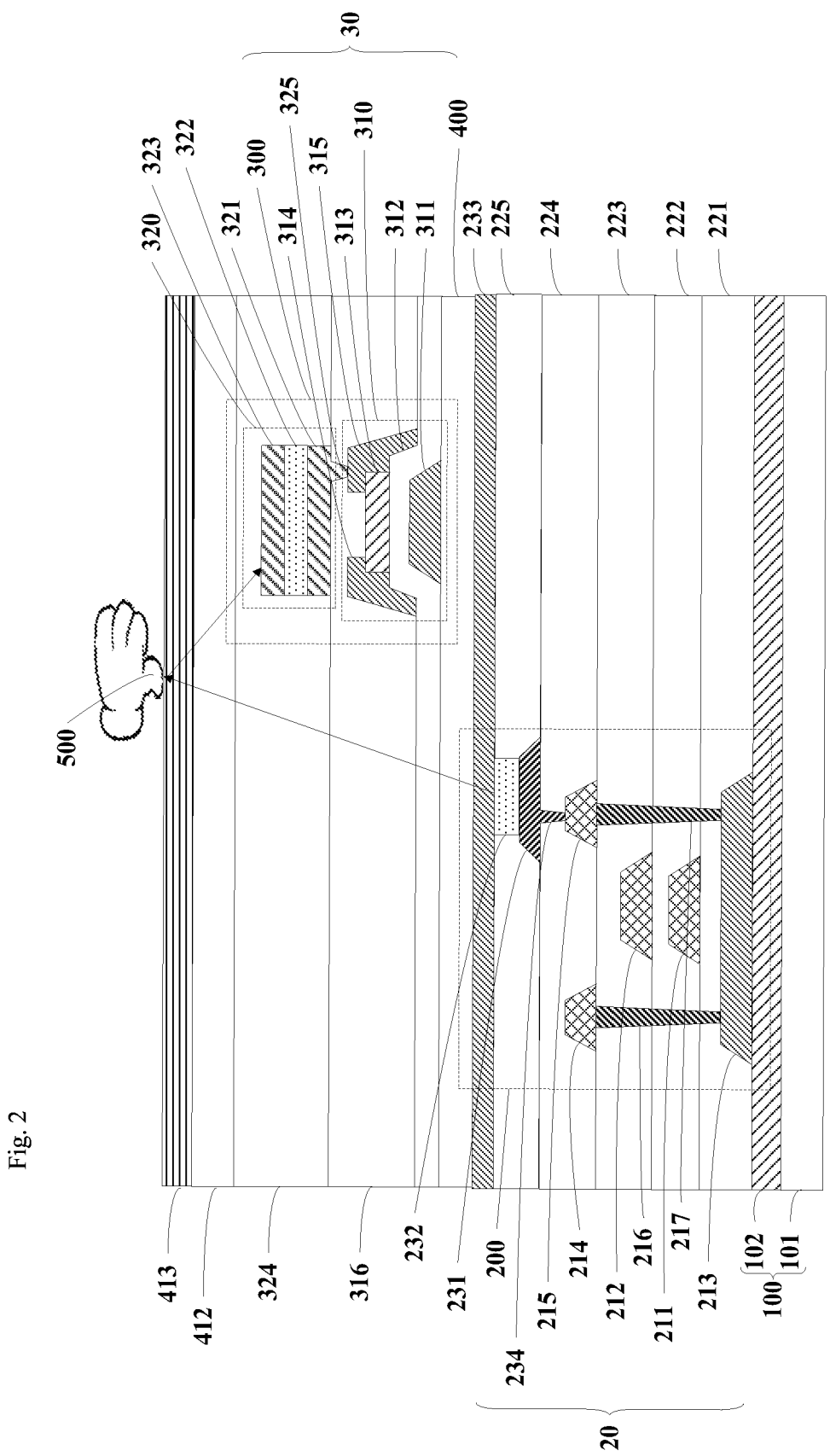
FIG. 2 is a schematic cross-sectional view showing a display panel according to another embodiment of the present disclosure.

FIG. 2 is a schematic cross-sectional view showing a display panel according to another embodiment of the present disclosure.

In some embodiments, as shown in FIG. 2, the pixel structure layer 20 further comprises a pixel defining layer 225. The pixel defining layer 225 has an opening. Each sub-pixel 200 comprises a functional layer 232. Functional layers 232 of different sub-pixels are spaced apart by the pixel defining layer 225. The functional layer 232 is in the opening of the pixel defining layer 225. An orthographic projection of the photoelectric conversion device 300 on the substrate 100 is inside an orthographic projection of the pixel defining layer 225 on the substrate 100. The orthographic projection of the photoelectric conversion device 300 on the substrate 100 does not overlap with an orthographic projection of the functional layer 232 on the substrate 100. In this embodiment, the photoelectric conversion device is disposed at a position where there is no light emitted between different sub-pixels. This not only does not affect the display effect of the display panel, but also facilitates the light emitted by a sub-pixel to enter the photoelectric conversion device after being reflected by an external object such as a fingerprint, thereby achieving the fingerprint recognition function.

In some embodiments, the sub-pixel 200 may comprise a green sub-pixel. The photoelectric conversion device 300 is above a pixel defining layer adjacent to a functional layer of the green sub-pixel. For example, one photoelectric conversion device 300 is provided above the pixel defining layer adjacent to the functional layer of each green sub-pixel. In this embodiment, by disposing the photoelectric conversion device above the pixel defining layer beside the green sub-pixel, it not only ensures that the photoelectric conversion device is at the position where there is no light emitted between sub-pixels, but also may meet the requirement of a fingerprint imaging resolution, thereby achieving the fingerprint recognition function in the display panel.

In some embodiments, the photoelectric conversion device 300 may comprise an organic photoelectric triode (OPT). The organic photoelectric triode serves as a photoelectric conversion device, which is conducive to achieving a large-screen or even full-screen fingerprint recognition function in a flexible screen. Furthermore, since the organic photoelectric triode has a relatively favorable flexibility, the manufacturing process of the organic photoelectric triode may be compatible with the manufacturing process of the flexible display panel.

In addition, those skilled in the art may understand that the photoelectric conversion device according to the embodiments of the present disclosure is not limited to the organic photoelectric triode. For example, the photoelectric conversion device may comprise a photoelectric conversion device manufactured using an inorganic material (e.g., gallium arsenide).

In some embodiments, as shown in FIG. 2, the organic photoelectric triode may comprise a thin film transistor 310 and an organic photoelectric structure 320 electrically connected to the thin film transistor 310. The thin film transistor 310 is on a side of the encapsulation layer 400 away from the pixel structure layer 20 (e.g., the sub-pixel 200 of the pixel structure layer). For example, the thin film transistor 310 is on the encapsulation layer 400.

In some embodiments, as shown in FIG. 2, the thin film transistor 310 comprises a gate 311. The gate 311 is above the encapsulation layer 400. For example, the gate 311 may be directly on the encapsulation layer 400. For another example, there may also be a second insulating layer (described later) between the encapsulation layer 400 and the gate 311. The thin film transistor 310 further comprises a first insulating layer 312 covering the gate 311. For example, a material of the first insulating layer 312 may comprise silicon dioxide, silicon nitride, or the like. The thin film transistor 310 further comprises a first organic semiconductor layer 313 on the first insulating layer 310. For example, a material of the first organic semiconductor layer 313 may comprise: poly(3-hexylthiophene):phenyl-C61-butyric acid methyl ester bulk heterojunction (P3HT:PC61BM BHJ), or the like. The thin film transistor 310 further comprises a source (which may be referred to as a first source) 314 and a drain (which may be referred to as a first drain) 315 each connected to the first organic semiconductor layer 313. Here, the organic semiconductor layer is used in the thin film transistor, which is advantageous for improving the flexibility of the display panel.

In some embodiments, as shown in FIG. 2, the thin film transistor 310 further comprises a third insulating layer 316 on the source 314, the drain 315, and the first organic semiconductor layer 313.

In some embodiments, as shown in FIG. 2, the organic photoelectric structure 320 comprises a first electrode layer 321 electrically connected to the source 314 or the drain 315. For example, the first electrode layer 321 may be electrically connected to the drain 315 (or the source 314) through a first conductive via 325. Here, the first conductive via 325 comprises a through hole passing through the third insulating layer 316 and exposing the drain 315 or the source 314 and a conductive material layer (e.g., a metal layer) in the through hole.

In some embodiments, as shown in FIG. 2, the organic photoelectric structure 320 further comprises an organic photoelectric conversion layer 322 on the first electrode layer 321. For example, a material of the organic photoelectric conversion layer 322 may comprise:
poly(2-methoxy-5(2'-ethylhexyloxy) phenylenevinylene): phenyl-C61-butyric acid methyl ester bulk heterojunction (MEH-PPV:PC61BM BHJ), or the like. When light is irradiated onto the organic photoelectric conversion layer, photons may transfer their energy to electrons within the organic photoelectric conversion layer so as to move the electrons, thereby forming a current. In this way, the photoelectric conversion function of the organic photoelectric conversion layer is achieved. The organic photoelectric conversion layer is used in the organic photoelectric structure, which is advantageous for improving the flexibility of the display panel.

In some embodiments, as shown in FIG. 2, the organic photoelectric structure 320 further comprises a second protective layer 323 on the organic photoelectric conversion layer 322. For example, a material of the second protective layer 323 comprises a photosensitive organic polymer (e.g., photoresist). Here, the second protective layer may protect the organic photoelectric conversion layer. In addition, the photosensitive organic polymer material is used for the second protective layer, which may improve the bending performance of the second protective layer.

In the above-described organic photoelectric triode, after an optical signal (e.g., the second light) enters the organic photoelectric conversion layer of the organic photoelectric structure 320, the organic photoelectric conversion layer converts the optical signal into an electrical signal, and transmits the electrical signal to a processing circuit through the thin film transistor 310. The processing circuit performs signal processing on the electrical signal to obtain relevant information (e.g., fingerprint information). In this way, the fingerprint recognition function may be achieved on the light exit surface of the display panel.

In some embodiments, as shown in FIG. 2, the substrate 100 may comprise a substrate layer 101 and a buffer layer 102 on the substrate layer 101. The sub-pixel 200 is on the buffer layer 102. For example, the substrate layer may comprise a flexible substrate layer. For example, a material of the buffer layer comprises silicon dioxide, silicon nitride, or the like.

In some embodiments, the sub-pixel 200 comprises a driving transistor and a light emitting device electrically connected to the driving transistor.

In some embodiments, as shown in FIG. 2, the driving transistor comprises a semiconductor layer (e.g., which may be referred to as a third semiconductor layer) 213 on the buffer layer 102. For example, a material of the semiconductor layer 213 may comprise polysilicon or the like. The driving transistor further comprises a first dielectric layer 221 covering the semiconductor layer 213. For example, a material of the first dielectric layer 221 may comprise silicon dioxide, silicon nitride, or the like. The driving transistor further comprises a control electrode 211 on the first dielectric layer 221. For example, the control electrode is a gate (which may be referred to as a second gate). The driving transistor may further comprise a second dielectric layer 222 covering the control electrode 211. For example, a material of the second dielectric layer 222 may comprise silicon dioxide, silicon nitride, or the like.

In some embodiments, as shown in FIG. 2, the sub-pixel 200 further comprises an electrode plate layer 212 on the second dielectric layer 222. The electrode plate layer 212 and the control electrode 211 may serve as two electrode plates of a capacitor.

In some embodiments, as shown in FIG. 2, the driving transistor further comprises a third dielectric layer 223 covering the electrode plate layer 212. For example, a material of the third dielectric layer 223 may comprise silicon dioxide, silicon nitride, or the like. The driving transistor further comprises a source (which may be referred to as a second source) 214 and a drain (which may be referred to as a second drain) 215 on the third dielectric layer 223. The source 214 is electrically connected to the semiconductor layer 213 through a second conductive via 216. Here, the second conductive via 216 passes through the third dielectric layer 223, the second dielectric layer 222, and the first dielectric layer 221 so as to be electrically connected to the semiconductor layer 213. The second conductive via 216 comprises a through hole passing through the third dielectric layer 223, the second dielectric layer 222 and the first dielectric layer 221, and a conductive material layer (e.g., a metal layer) in the through hole. The drain 215 is electrically connected to the semiconductor layer 213 through a third conductive via 217. Here, the third conductive via 217 passes through the third dielectric layer 223, the second dielectric layer 222 and the first dielectric layer 221 so as to be electrically connected to the semiconductor layer 213. The third conductive via 217 comprises a through hole passing through the third dielectric layer 223, the second dielectric layer 222 and the first dielectric layer 221, and a conductive material layer (e.g., a metal layer) in the through hole.

In some embodiments, as shown in FIG. 2, the driving transistor further comprises a planarization layer 224 covering the source 214 and the drain 215. A material of the planarization layer 224 comprises an insulating material, such as a photosensitive organic polymer. For example, the photosensitive organic polymer may comprise photoresist or the like. As shown in FIG. 2, the pixel defining layer 225 is on the planarization layer 224.

In some embodiments, the light emitting device described above comprises a second electrode layer (e.g., an anode layer) 231 on the planarization layer 224. The second electrode layer 231 is electrically connected to the drain 215 (or the source 214) through a fourth conductive via 234. The fourth conductive via 234 comprises a through hole passing through the planarization layer 224 and exposing the drain 215 (or the source 214) and a conductive material layer (e.g., a metal layer) in the through hole. The light emitting device further comprises a functional layer 232 in the opening of the pixel defining layer 225 and on the second electrode layer 231. For example, the functional layer 232 may comprise an electron transport layer, a hole transport layer, a light emitting layer, and the like. The light emitting device further comprises a third electrode layer (e.g., a cathode layer) 233 on the functional layer 232. In some embodiments, as shown in FIG. 2, the encapsulation layer 400 covers the third electrode layer 233.

In the above-described embodiments, during the operation of the sub-pixel, the driving transistor may transmit a driving current to the light emitting device so as to drive the light emitting device to emit light. For example, the first light emitted by the light emitting device is reflected by an external object (e.g., a fingerprint) to produce a second light, and the photoelectric conversion device receives the second light and converts the second light into an electrical signal. After the electrical signal is processed, relevant information (e.g., fingerprint information) of the external object may be obtained.

In some embodiments, as shown in FIG. 2, the display panel may further comprise a fourth dielectric layer 324 covering the organic photoelectric structure 320. The fourth dielectric layer 324 may comprise silicon dioxide, silicon nitride, or the like.

In some embodiments, as shown in FIG. 2, the display panel may further comprise a polarizer (POL) layer 412 on the fourth dielectric layer 324. The cover plate 413 is on the POL layer 412. For example, the POL layer may comprise a polyvinyl alcohol (PVA) layer, a cellulose triacetate (TAC) layer, a pressure-sensitive adhesive film (PSA film), a release film, a protective film, and the like.

Figure 3:
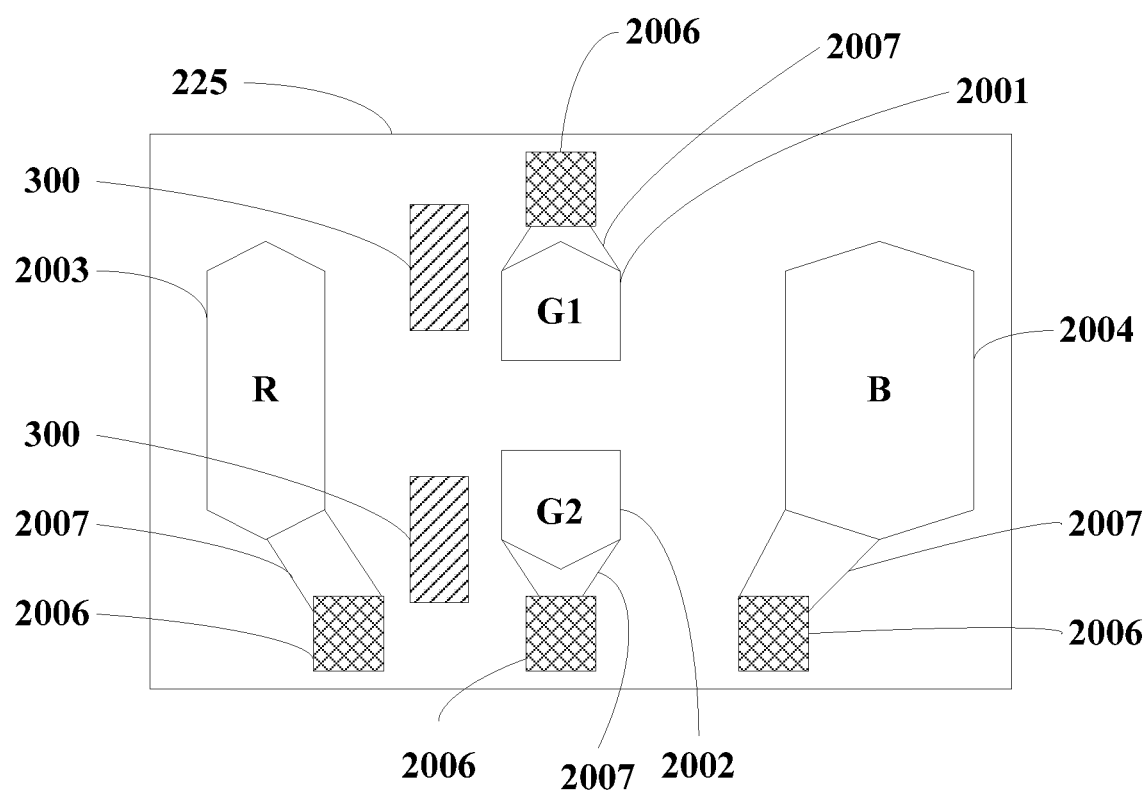
FIG. 3 is a top view showing an opening of a sub-pixel of a display panel according to an embodiment of the present disclosure.

FIG. 3 is a top view showing an opening of a sub-pixel of a display panel according to an embodiment of the present disclosure. FIG. 3 shows a first opening 2001 for a first green sub-pixel G1, a second opening 2002 for a second green sub-pixel G2, a third opening 2003 for a red sub-pixel R, and a fourth opening 2004 of a blue sub-pixel B. The opening here refers to an opening of the pixel defining layer 225. A functional layer of a corresponding sub-pixel is provided in the opening. In addition, FIG. 3 also shows a connecting piece 2006 connected to a sub-pixel and a contact pad 2007 connected to the connecting piece 2006.

As shown in FIG. 3, the photoelectric conversion device 300 is provided at a position where there is no light emitted between different sub-pixels. For example, the photoelectric conversion device 300 is above a portion of the pixel defining layer adjacent to the functional layer of the green sub-pixel (e.g., the first green sub-pixel G1 and the second green sub-pixel G2). One photoelectric conversion device 300 may be provided above the pixel defining layer adjacent to the functional layer of each green sub-pixel. In this way, the photoelectric conversion device can be guaranteed to be at the position where no light is emitted between the sub-pixels, and the requirement of fingerprint imaging resolution can be met, thereby achieving the fingerprint recognition function in the display panel.

Figure 4:
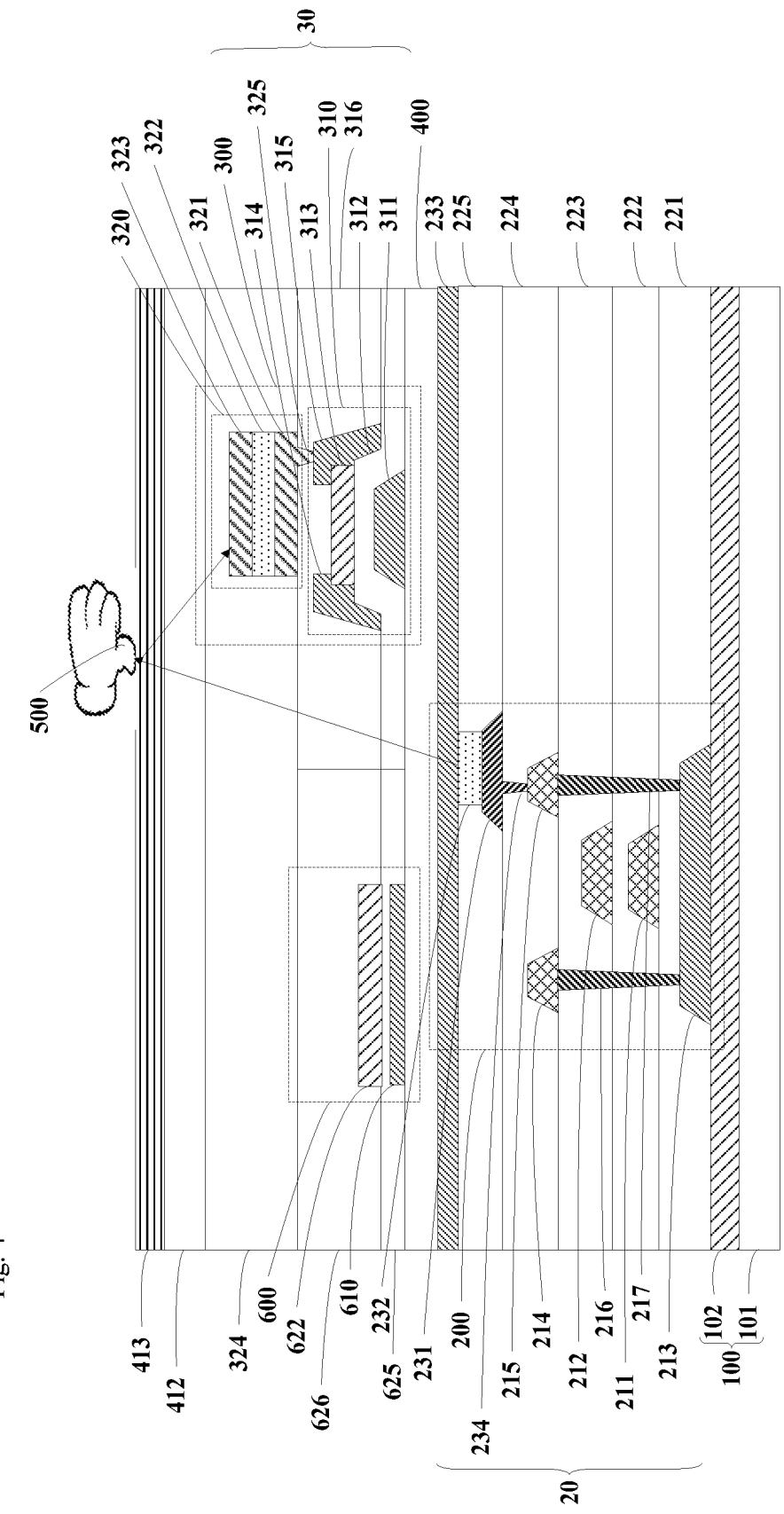
FIG. 4 is a schematic cross-sectional view showing a display panel according to another embodiment of the present disclosure.

FIG. 4 is a schematic cross-sectional view showing a display panel according to another embodiment of the present disclosure.

In some embodiments, the sensor layer 30 may further comprise a touch device 600. For example, as shown in FIG. 4, the touch device 600 comprises a touch electrode layer 610 above the encapsulation layer 400.

Figure 5:
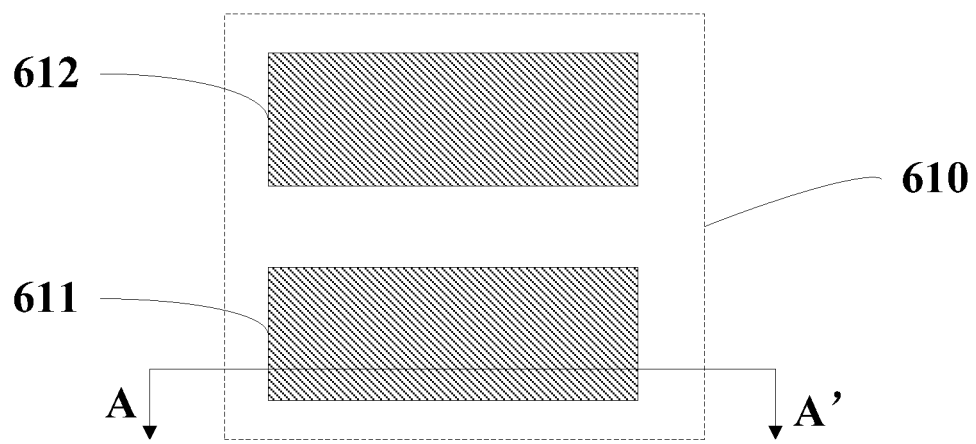
FIG. 5 is a top view showing a touch electrode layer of a touch device according to an embodiment of the present disclosure.

FIG. 5 is a top view showing a touch electrode layer of a touch device according to an embodiment of the present disclosure. For example, as shown in FIG. 5, the touch electrode layer 610 comprises a first touch electrode 611 and a second touch electrode 612 spaced apart from the first touch electrode 611. For example, the touch electrode layer 610 in FIG. 4 is a cross-sectional view of the structure taken along line A-A' in FIG. 5.

In some embodiments, as shown in FIGS. 4 and 5, the first touch electrode 611 and the second touch electrode 612 are both in the same layer as the gate 311. This facilitates the manufacture of the display panel. It should be noted that, "the same layer" refers to a layer structure formed by using the same film-forming process to form a film layer for forming a specific pattern, and then using the same mask through a single patterning process. Depending on different specific patterns, a single patterning process may comprise a plurality of exposure, development, or etching processes, while the specific patterns in the formed layer structure may be continuous or discontinuous. These specific patterns may also be at different heights or have different thicknesses.

In other embodiments, the first touch electrode 611 is in a same layer as the gate 311, and the second touch electrode 612 is above or below the first touch electrode 611 (to be described later in conjunction with the accompanying drawings). The first touch electrode 611 is spaced apart from the second touch electrode 612.

In some embodiments of the present disclosure, when a finger presses the screen, a capacitance formed by the first touch electrode and the second touch electrode changes, thereby resulting in a change in a voltage between the two touch electrodes. A touch operation or a touch position may be obtained by detecting the change of the voltage, thereby achieving the touch function.

In some embodiments, as shown in FIG. 4, the touch device 600 may further comprise a fifth insulating layer 625 covering the touch electrode layer 610. For example, a material of the fifth insulating layer 625 is the same as the material of the first insulating layer 312. The fifth insulating layer 625 is in the same layer as the first insulating layer 312. For example, the fifth insulating layer 625 is connected to the first insulating layer 312. This facilitates the manufacture of the display panel.

In some embodiments, as shown in FIG. 4, the touch device 600 may further comprise a second organic semiconductor layer 622 on the fifth insulating layer 625. The second organic semiconductor layer 622 is in the same layer as the first organic semiconductor layer 313. For example, a material of the second organic semiconductor layer 622 is the same as the material of the first organic semiconductor layer 313. This facilitates the manufacture of the display panel.

In some embodiments, as shown in FIG. 4, the touch device 600 may further comprise a sixth insulating layer 626 covering the second organic semiconductor layer 622. For example, a material of the sixth insulating layer 626 is the same as the material of the third insulating layer 316. The sixth insulating layer 626 is in the same layer as the third insulating layer 316. For example, the sixth insulating layer 626 is connected to the third insulating layer 316. This facilitates the manufacture of the display panel.

Figure 6:
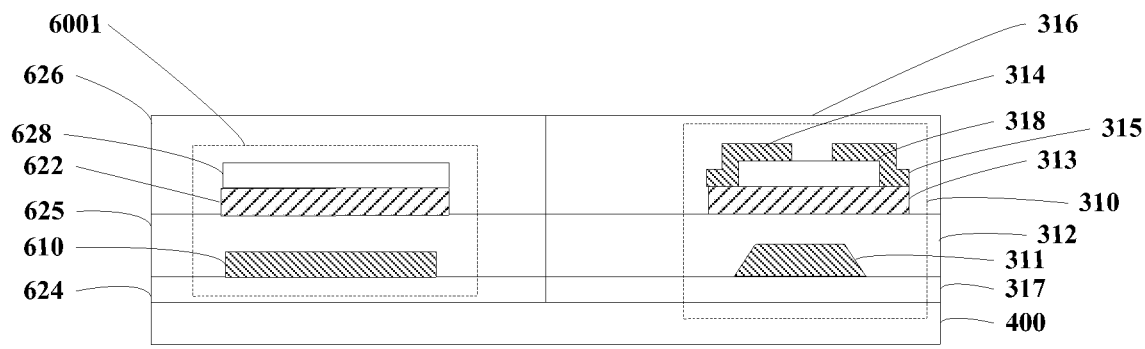
FIG. 6 is a schematic cross-sectional view showing a display panel according to another embodiment of the present disclosure.

FIG. 6 is a schematic cross-sectional view showing a display panel according to another embodiment of the present disclosure. FIG. 6 shows the thin film transistor 310 and a touch device 6001 in the display panel. For convenience of illustration, other structures of the display panel are not shown in FIG. 6.

As shown in FIG. 6, the thin film transistor 310 comprises the gate 311, the first insulating layer 312, the first organic semiconductor layer 313, the source 314 and the drain 315.

In some embodiments, as shown in FIG. 6, the thin film transistor 310 may further comprise a first protective layer 318 on the first organic semiconductor layer 313. The first protective layer 318 exposes two portions of the first organic semiconductor layer 313. The source 314 covers a portion of the first protective layer 318 and a portion of the first organic semiconductor layer 313, and the drain 315 covers another portion of the first protective layer 318 and another portion of the first organic semiconductor layer 313. For example, a material of the first protective layer 318 may comprise photoresist or the like. During the manufacturing process, the first protective layer may be used to effectively protect the first organic semiconductor layer 313 when the source and drain are formed by an etching process.

In some embodiments, as shown in FIG. 6, the thin film transistor 310 may further comprise a second insulating layer 317 between the encapsulation layer 400 and the gate 311. For example, a material of the second insulating layer 317 may comprise silicon nitride or the like. The second insulating layer 317 may function as a buffer layer.

In some embodiments, as shown in FIG. 6, the thin film transistor 310 may further comprise a third insulating layer 316 on the source 314, the drain 315, and the first protective layer 318. The third insulating layer 316 covers the source 314, the drain 315, the first protective layer 318, the first insulating layer 312, and the like. For example, a material of the third insulating layer 316 may comprise silicon nitride or the like.

As shown in FIG. 6, the touch device 6001 comprises the touch electrode layer 610. The touch electrode layer 610 may comprise the first touch electrode 611 and the second touch electrode 612 spaced apart from the first touch electrode as shown in FIG. 5.

In some embodiments, as shown in FIG. 6, the touch device 6001 may further comprise a fourth insulating layer 624 on the encapsulation layer 400. The fourth insulating layer 624 is in the same layer as the second insulating layer 317.

The touch device 6001 may further comprise a fifth insulating layer 625 on the fourth insulating layer 624. The fifth insulating layer 625 is in the same layer as the first insulating layer 312.

The touch device 6001 may further comprise a second organic semiconductor layer 622 on the fifth insulating layer 625. The second organic semiconductor layer 622 is in the same layer as the first organic semiconductor layer 313.

The touch device 6001 may further comprise a third protective layer 628 on the second organic semiconductor layer 622. The third protective layer 628 is in the same layer as the first protective layer 318. For example, a material of the third protective layer 628 may comprise photoresist or the like.

The touch device 6001 may further comprise a sixth insulating layer 626 covering the third protective layer 628. For example, the sixth insulating layer 626 may directly cover the third protective layer 628. For another example, there may be also another structural layer between the sixth insulating layer 626 and the third protective layer 628, so that the sixth insulating layer 626 may indirectly cover the third protective layer 628. The sixth insulating layer 626 is in the same layer as the third insulating layer 316.

In the above-described embodiments, the above-described layer structure is provided in the touch device, which facilitates the formation of the touch device during the process of forming the thin film transistor 310, thereby facilitating the manufacture of the display panel.

Figure 7:
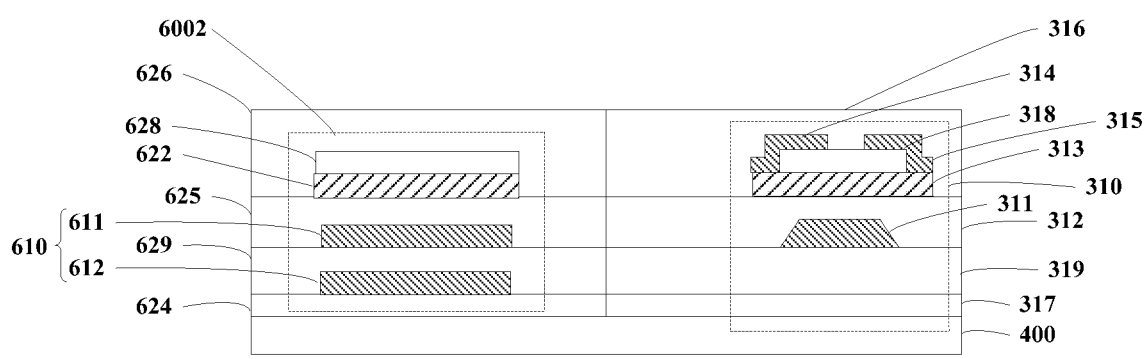
FIG. 7 is a schematic cross-sectional view showing a display panel according to another embodiment of the present disclosure.

FIG. 7 is a schematic cross-sectional view showing a display panel according to another embodiment of the present disclosure.

Similar to FIG. 6, FIG. 7 shows the thin film transistor 310 and a touch device 6002 in the display panel. The touch device 6002 comprises the touch electrode layer 610. The touch electrode layer 610 comprises the first touch electrode 611 and the second touch electrode 612 spaced apart from the first touch electrode 611. For example, the first touch electrode 611 is in the same layer as the gate 311. The second touch electrode 612 is below the first touch electrode 611. In other embodiments, the second touch electrode 612 may be above the first touch electrode 611 (not shown). As shown in FIG. 7, the first touch electrode 611 and the second touch electrode 612 are spaced apart by a seventh insulating layer 629.

In some embodiments, the thin film transistor 310 may further comprise an eighth insulating layer 319 between the second insulating layer 317 and the gate 311. The eighth insulating layer 319 is in the same layer as the seventh insulating layer 629. For example, the eighth insulating layer 319 is connected to the seventh insulating layer 629. In addition, other layer structures shown in FIG. 7 have been described in detail previously, and thus will not be repeated here.

FIG. 8 is a schematic cross-sectional view showing a display panel according to another embodiment of the present disclosure.

Similar to FIG. 6, FIG. 8 shows the thin film transistor 310 and a touch device 6003 of the display panel. The touch device 6003 comprises the touch electrode layer 610 above the encapsulation layer 400. The touch electrode layer 610 may comprise the first touch electrode 611 and the second touch electrode 612 spaced apart from the first touch electrode 611 as shown in FIG. 5. The first touch electrode 611 and the second touch electrode 612 are both in the same layer as the source 314 and the drain 315. This facilitates the manufacture of the display panel. In addition, the first touch electrode and the second touch electrode are designed to be in the same layer as the source and the drain, so as to cause the first touch electrode and the second touch electrode to be both at a relatively long distance from the third electrode layer (for example, the cathode layer) of the sub-pixel, so that a parasitic capacitance formed between the touch device and the third electrode layer is relatively small. This may make the touch device less affected by a signal of the third electrode layer, thereby reducing noise and improving a signal-to-noise ratio of the touch device.

In addition, other layer structures shown in FIG. 8 have been described previously, and thus will not be repeated here.

FIG. 9 is a schematic cross-sectional view showing a display panel according to another embodiment of the present disclosure.

Similar to FIG. 7, FIG. 9 shows the thin film transistor 310 and a touch device 6004 of the display panel. The touch device 6004 comprises the touch electrode layer 610 above the encapsulation layer 400. The touch electrode layer 610 comprises the first touch electrode 611 and the second touch electrode 612 spaced apart from the first touch electrode 611. The first touch electrode 611 is in the same layer as the source 314 and the drain 315. The second touch electrode 612 is above the first touch electrode 611. In other embodiments, the second touch electrode 612 may be below the first touch electrode 611 (not shown). In addition, the first touch electrode is designed to be in the same layer as the source and the drain, and the second touch electrode is above or below the first touch electrode, so as to cause the first touch electrode and the second touch electrode to be both at a relatively long distance from the third electrode (for example, the cathode layer) layer of the sub-pixel, so that a parasitic capacitance formed between the touch device and the third electrode layer is relatively small. This may make the touch device less affected by a signal of the third electrode layer, thereby reducing the noise and improving the signal-to-noise ratio of the touch device.

In some embodiments, as shown in FIG. 9, the first touch electrode 611 and the second touch electrode 612 are spaced apart by the sixth insulating layer 626. The sixth insulating layer 626 covers the first touch electrode 611, and the second touch electrode 612 is on the sixth insulating layer 626.

In some embodiments, the display panel may further comprise a ninth insulating layer 630 covering the second touch electrode 612 and a tenth insulating layer 330 covering the third insulating layer 316. For example, a material of the ninth insulating layer 630 is the same as a material of the tenth insulating layer 330. For example, the materials of the ninth insulating layer 630 and the tenth insulating layer 330 may comprise silicon dioxide, silicon nitride, or the like. The ninth insulating layer 630 is in the same layer as the tenth insulating layer 330 For example, the ninth insulating layer 630 is connected to the tenth insulating layer 330. This facilitates the manufacture of the display panel. In addition, other layer structures shown in FIG. 9 have been described previously, and thus will not be repeated here.

It should be noted that shapes of the source 314 and the drain 315 may be the shapes shown in FIG. 2 or 4 or the shapes shown in FIG. 6, 7, 8, or 9. Therefore, the scope according to the embodiments of the present disclosure is not limited to the shapes of the source 314 and the drain 315 disclosed here.

In some embodiments of the present disclosure, a display device is also provided. The display device may comprise the display panel as described above. The display device may be any product or member with a display function, such as a mobile phone, a tablet computer, a television, a display, a notebook computer, a digital photo frame, a navigator, or the like.

Figure 11A:
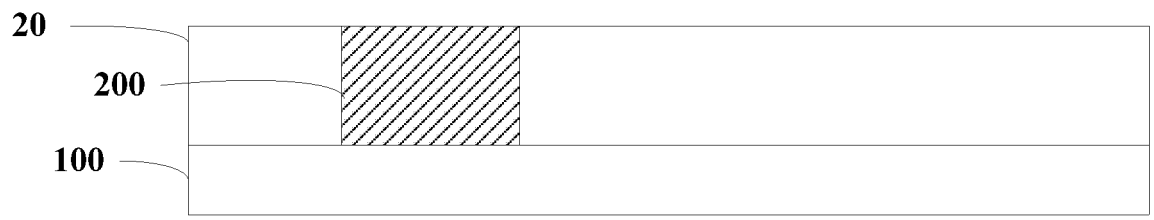
FIG. 11A is a schematic cross-sectional view showing a structure at a stage during a manufacturing process of a display panel according to an embodiment of the present disclosure.
Figure 11B:
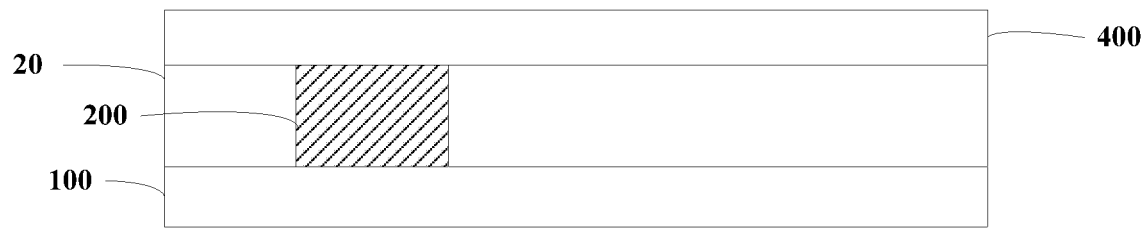
FIG. 11B is a schematic cross-sectional view showing a structure at another stage during a manufacturing process of a display panel according to an embodiment of the present disclosure.

FIG. 10 is a flowchart showing a manufacturing method of a display panel according to an embodiment of the present disclosure. As shown in FIG. 10, the manufacturing method comprises steps S1002 to S1004. FIGS. 11A, 11B, and FIG. 1 are schematic cross-sectional views showing structures at several stages during a manufacturing process of a display panel according to some embodiments of the present disclosure. The manufacturing method of a display panel according to some embodiments of the present disclosure will be described in detail below in conjunction with FIGS. 10, 11A, 11B, and 1.

As shown in FIG. 10, at step S1002, a pixel structure layer is formed on a substrate, wherein the pixel structure layer comprises a plurality of sub-pixels. For example, as shown in FIG. 11A, a pixel structure layer 20 is formed on a substrate 100. The pixel structure layer 20 comprises a plurality of sub-pixels 200. At least one of the plurality of sub-pixels 200 is configured to emit a first light.

Returning to FIG. 10, at step S1004, a sensor layer is formed on a side of the pixel structure layer away from the substrate, wherein the sensor layer comprises a photoelectric conversion device.

For example, as shown in FIG. 11B, an encapsulation layer 400 is formed on the pixel structure layer 20. Next, as shown in FIG. 1, a sensor layer 30 is formed on a side of the pixel structure layer 20 away from the substrate 100. For example, the sensor layer 30 is formed on the encapsulation layer 400. The sensor layer 30 comprises a photoelectric conversion device 300. The photoelectric conversion device 300 is formed on a side of the encapsulation layer 400 away from the pixel structure layer 20. For example, the photoelectric conversion device 300 is formed on the encapsulation layer 400. The photoelectric conversion device 300 is configured to receive a second light 520 produced after the first light 510 is reflected by an external object 500 and convert the second light 520 into an electrical signal.

So far, a manufacturing method of a display panel according to an embodiment of the present disclosure is provided. In the manufacturing method, a pixel structure layer is formed on a substrate, wherein the pixel structure layer comprising a plurality of sub-pixels; and a sensor layer is formed on a side of the pixel structure layer away from the substrate, wherein the sensor layer comprises a photoelectric conversion device. In this way, the photoelectric conversion device may be formed on a light exit side of the display panel. As a result, a number of photoelectric conversion devices may be provided in the display panel, which facilitates achieving a large-screen and even a full-screen fingerprint recognition function.

In some embodiments, the photoelectric conversion device comprises an organic photoelectric triode. The organic photoelectric triode comprises a thin film transistor and an organic photoelectric structure electrically connected to the thin film transistor. The above-described sensor layer may further comprise a touch device. In some embodiments, the step of forming the sensor layer may comprise: forming the thin film transistor and the organic photoelectric structure of the organic photoelectric triode, and forming the touch device.

FIGS. 12A to 12D are schematic cross-sectional views showing structures at several stages during a manufacturing process of an organic photoelectric triode for a display panel according to some embodiments of the present disclosure. The manufacturing process of the organic photoelectric triode is described in detail below in conjunction with FIGS. 12A to 12D.

Figure 12A:
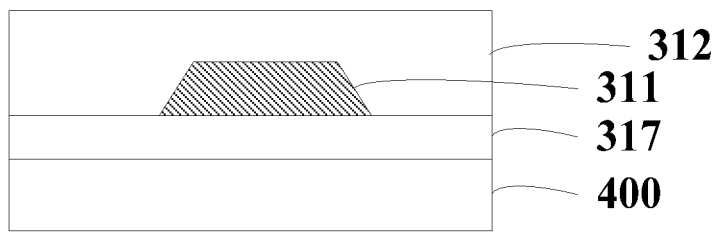
FIG. 12A is a schematic cross-sectional view showing a structure at a stage during a manufacturing process of an organic photoelectric triode for a display panel according to an embodiment of the present disclosure.

First, as shown in FIG. 12A, a second insulating layer 317 is formed on the encapsulation layer 400 by a process such as deposition or the like.

Next, as shown in FIG. 12A, a gate 311 is formed on the second insulating layer 317, for example, by processes such as deposition, patterning and the like.

Next, as shown in FIG. 12A, a first insulating layer 312 covering the gate 311 is formed by a process such as deposition or the like.

Figure 12B:
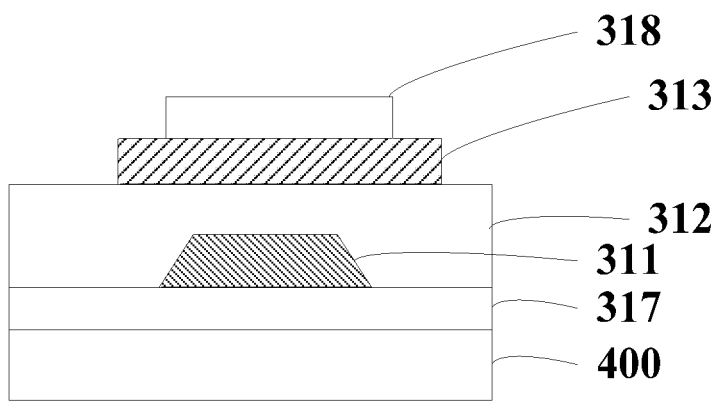
FIG. 12B is a schematic cross-sectional view showing a structure at another stage during a manufacturing process of an organic photoelectric triode for a display panel according to an embodiment of the present disclosure.

Next, as shown in FIG. 12B, for example, a first organic semiconductor layer 313 is formed on the first insulating layer 312 by processes such as coating, exposure, development, and the like.

Next, as shown in FIG. 12B, a first protective layer 318 is formed on the first organic semiconductor layer 313. For example, an asking process may be performed on the first protective layer 318, so that the first protective layer 318 exposes two portions of the first organic semiconductor layer 313, so as to form a source and a drain each connected to the first organic semiconductor layer 313.

Figure 12C:
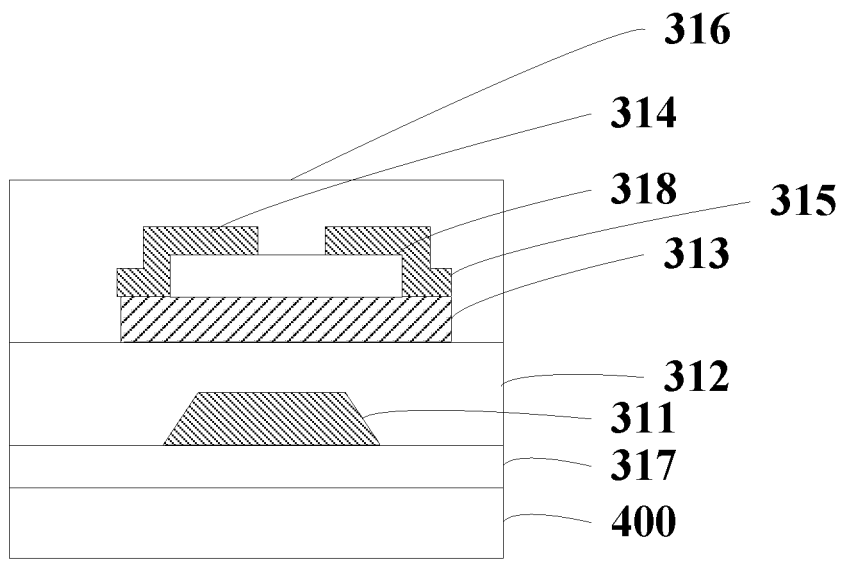
FIG. 12C is a schematic cross-sectional view showing a structure at another stage during a manufacturing process of an organic photoelectric triode for a display panel according to an embodiment of the present disclosure.

Next, as shown in FIG. 12C, a source 314 and a drain 315 each connected to the first organic semiconductor layer 313 are formed by processes such as deposition, patterning, and the like. During the patterning process, the first protective layer 318 may protect the first organic semiconductor layer 313. The source 314 covers a portion of the first protective layer 318 and a portion of the first organic semiconductor layer 313 (i.e., one of two exposed portions of the first organic semiconductor layer 313), and the drain 315 covers another portion of the first protective layer 318 and another portion of the first organic semiconductor layer 313 (i.e., the other of the two exposed portions of the first organic semiconductor layer 313).

Next, as shown in FIG. 12C, a third insulating layer 316 is formed on the source 314, the drain 315, and the first protective layer 318, for example, by a process such as deposition or the like.

By the steps described above, the thin film transistor of the organic photoelectric triode is formed.

Figure 12D:
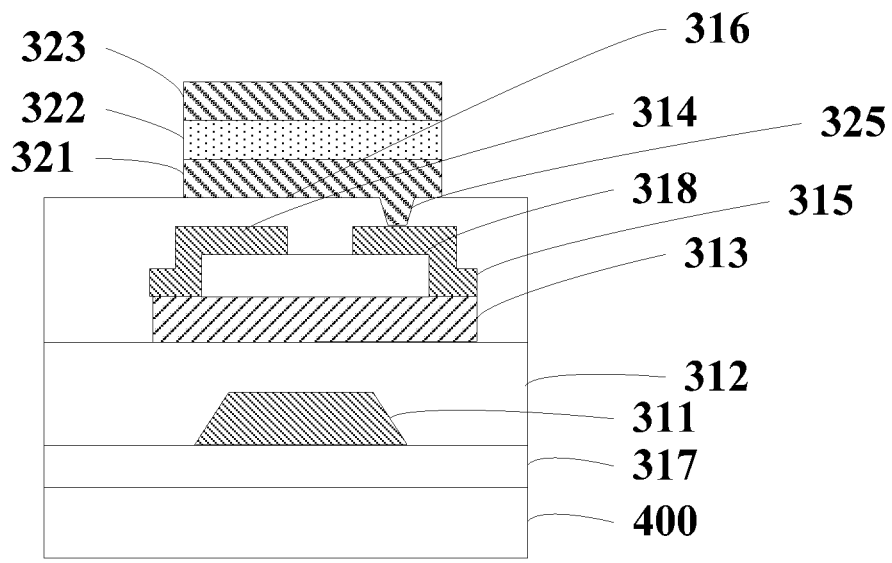
FIG. 12D is a schematic cross-sectional view showing a structure at another stage during a manufacturing process of an organic photoelectric triode for a display panel according to an embodiment of the present disclosure.

Next, as shown in FIG. 12D, a first electrode layer 321 electrically connected to the source 314 or the drain 315 is formed. For example, a first conductive via 325 passing through the third insulating layer 316 may be formed by processes such as patterning, deposition, and the like. The first conductive via 325 is connected to the drain 315 (or the source 314). Then, the first electrode layer 321 is formed on the third insulating layer 316 by processes such as deposition, patterning, and the like. The first electrode layer 321 is connected to the first conductive via 325.

Next, as shown in FIG. 12D, an organic photoelectric conversion layer 322 is formed on the first electrode layer 321 by processes such as coating, exposure, development, and the like.

Next, as shown in FIG. 12D, a second protective layer 323 is formed on the organic photoelectric conversion layer 322 by a process such as deposition (e.g., chemical vapor deposition) or the like.

By the steps described above, the organic photoelectric structure of the organic photoelectric triode is formed.

So far, an organic photoelectric triode for a display panel according to some embodiments of the present disclosure has been formed. During a manufacturing process of the organic photoelectric triode of the embodiment, the organic semiconductor layer is used for the thin film transistor and the organic photoelectric conversion layer is used for the organic photoelectric structure, which both facilitate improving the flexibility of the display panel.

In some embodiments, the step of forming the touch device may comprise: forming a touch electrode layer above the encapsulation layer. The touch electrode layer comprises a first touch electrode and a second touch electrode spaced apart from the first touch electrode. For example, the first touch electrode, the second touch electrode, and the gate (e.g., the gate 311) are formed by the same patterning process. For another example, the first touch electrode and the gate (e.g., the gate 311 of the thin film transistor 310) are formed by the same patterning process, and the second touch electrode is formed above or below the first touch electrode.

It should be noted that, the same patterning process refers to forming a film layer for forming a specific pattern using the same film forming process, and then forming a layer structure by a single patterning process using the same mask. It should be noted that, depending on different specific patterns, a single patterning process may comprise a plurality of exposure, development, or etching processes. The specific patterns in the formed layer structure may be continuous or discontinuous. These specific patterns may also be at different heights or have different thicknesses.

In some embodiments, the step of forming the touch device may further comprise: forming a fourth insulating layer on the encapsulation layer; forming a fifth insulating layer on the fourth insulating layer; forming a second organic semiconductor layer on the fifth insulating layer; forming a third protective layer on the second organic semiconductor layer; and forming a sixth insulating layer covering the third protective layer.

FIGS. 13A to 13C and FIG. 6 are schematic cross-sectional views showing structures at several stages during a manufacturing process of a display panel according to other embodiments of the present disclosure. The manufacturing process of the display panel according to other embodiments of the present disclosure will be described in detail below in conjunction with FIGS. 13A to 13C and FIG. 6. In this manufacturing process, the process of forming a thin film transistor and a touch device of the organic photoelectric triode is mainly described.

Figure 13A:
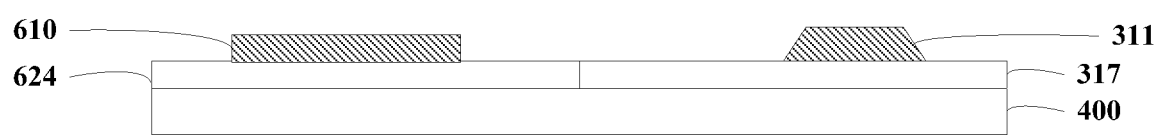
FIG. 13A is a schematic cross-sectional view showing a structure at a stage during a manufacturing process of a display panel according to another embodiment of the present disclosure.

First, as shown in FIG. 13A, a second insulating layer 317 is formed on an encapsulation layer 400, and a fourth insulating layer 624 is formed on the encapsulation layer 400. For example, the fourth insulating layer 624 is formed integrally with the second insulating layer 317.

Next, as shown in FIG. 13A, a gate 311 is formed on the second insulating layer 317, and a touch electrode layer 610 is formed on the fourth insulating layer 624 (i.e., above the encapsulation layer 400). The touch electrode layer 610 may comprise a first touch electrode 611 and a second touch electrode 612 spaced apart from the first touch electrode 611 (which may refer to FIG. 5 above). For example, the first touch electrode 611, the second touch electrode 612 and the gate 311 are formed by the same patterning process.

Figure 13B:
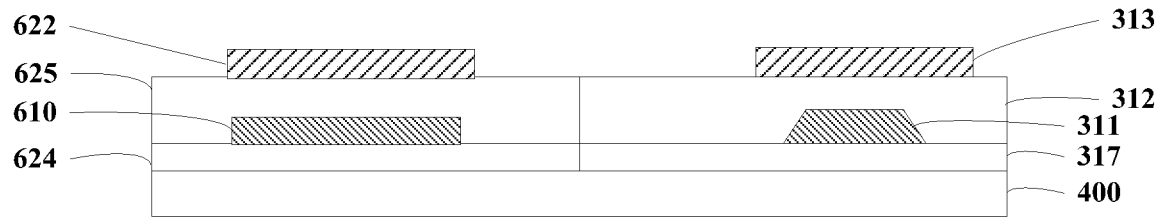
FIG. 13B is a schematic cross-sectional view showing a structure at another stage during a manufacturing process of a display panel according to another embodiment of the present disclosure.

Next, as shown in FIG. 13B, a first insulating layer 312 covering the gate 311 is formed, and a fifth insulating layer 625 is formed on the fourth insulating layer 624. The fifth insulating layer covers the touch electrode layer 610. For example, the fifth insulating layer 625 is formed integrally with the first insulating layer 312.

Next, as shown in FIG. 13B, a first organic semiconductor layer 313 is formed on the first insulating layer 312, and a second organic semiconductor layer 622 is formed on the fifth insulating layer 625. For example, the second organic semiconductor layer 622 and the first organic semiconductor layer 313 are formed by the same patterning process.

Figure 13C:
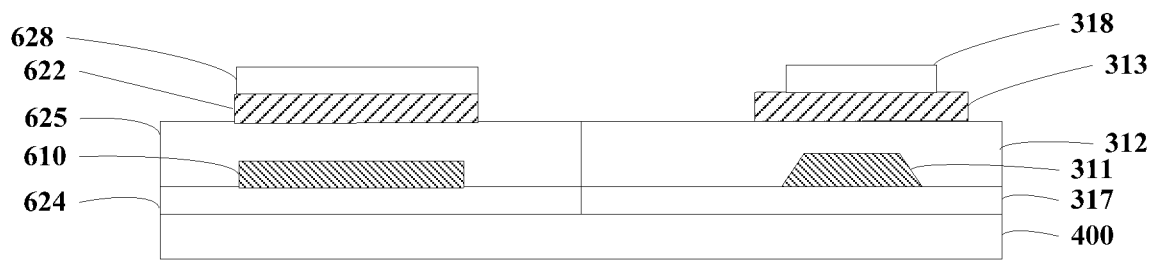
FIG. 13C is a schematic cross-sectional view showing a structure at another stage during a manufacturing process of a display panel according to another embodiment of the present disclosure.

Next, as shown in FIG. 13C, a first protective layer 318 is formed on the first organic semiconductor layer 313, and a third protective layer 628 is formed on the second organic semiconductor layer 622. For example, the third protective layer 628 and the first protective layer 318 are formed by the same patterning process.

Next, as shown in FIG. 6, a source 314 and a drain 315 each connected to the first organic semiconductor layer 313 are formed.

Next, as shown in FIG. 6, a third insulating layer 316 is formed on the source 314, the drain 315 and the first protective layer 318, and a sixth insulating layer 626 covering the third protective layer 628 is formed. For example, the sixth insulating layer 626 is formed integrally with the third insulating layer 316.

So far, a manufacturing method of a display panel according to other embodiments of the present disclosure is provided. In the manufacturing method, a touch device is also formed during the process of forming the thin film transistor of the organic photoelectric triode. By integrating the manufacturing processes of these two devices, the manufacturing of the display panel can be facilitated. In addition, the above-described manufacturing method may reduce additional processes such as exposure, development and etching that are brought about in the case where the organic photoelectric triode and the touch device are manufactured respectively. Therefore, the above-described manufacturing method may save the manufacturing cost.

The manufacturing processes of the thin film transistor and the touch device in the case where the first touch electrode and the second touch electrode are both on the same layer as the gate are described above in conjunction with FIGS. 13A to 13C and FIG. 6. In other embodiments, the first touch electrode and the gate may be formed by the same patterning process, and the second touch electrode spaced apart from the first touch electrode may be formed after or before the first touch electrode is formed, so that the second touch electrode is formed above or below the first touch electrode.

In other embodiments, the step of forming the touch device comprises: forming the touch electrode layer above the encapsulation layer. The touch electrode layer comprises a first touch electrode and a second touch electrode spaced apart from the first touch electrode. For example, the first touch electrode, the second touch electrode, the source (e.g., the source 314) and the drain (e.g., the drain 315) are formed by the same patterning process. For another example, the first touch electrode, the source (e.g., the source 314) and drain (e.g., the drain 315) are formed by the same patterning process, and the second touch electrode is formed above or below the first touch electrode.

FIGS. 14A to 14C and FIG. 8 are schematic cross-sectional views showing structures at several stages during a manufacturing process of a display panel according to other embodiments of the present disclosure. The manufacturing process of the display panel according to other embodiments of the present disclosure will be described in detail below in conjunction with FIGS. 14A to 14C and FIG. 8. In the manufacturing process, the process of forming a thin film transistor and a touch device of an organic photoelectric triode is mainly described.

Figure 14A:
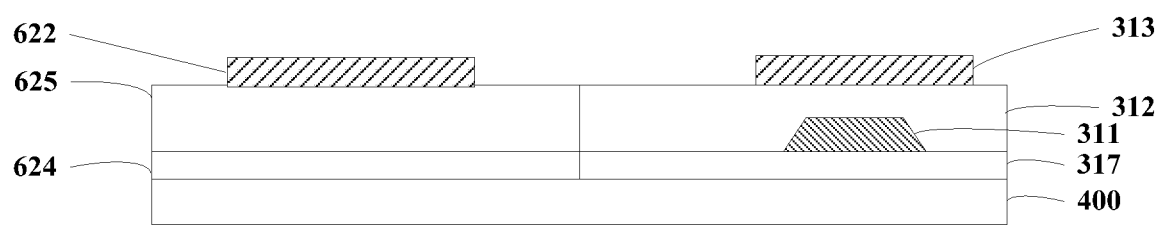
FIG. 14A is a schematic cross-sectional view showing a structure at a stage during a manufacturing process of a display panel according to another embodiment of the present disclosure.

First, as shown in FIG. 14A, a second insulating layer 317 is formed on an encapsulation layer 400, and a fourth insulating layer 624 is formed on the encapsulation layer 400. For example, the fourth insulating layer 624 is formed integrally with the second insulating layer 317.

Next, as shown in FIG. 14A, a gate 311 is formed on the second insulating layer 317.

Next, as shown in FIG. 14A, a first insulating layer 312 covering the gate 311 is formed, and a fifth insulating layer 625 is formed on the fourth insulating layer 624. For example, the fifth insulating layer 625 is formed integrally with the first insulating layer 312.

Next, as shown in FIG. 14A, a first organic semiconductor layer 313 is formed on the first insulating layer 312, and a second organic semiconductor layer 622 is formed on the fifth insulating layer 625. For example, the second organic semiconductor layer 622 and the first organic semiconductor layer 313 are formed by the same patterning process.

Figure 14B:
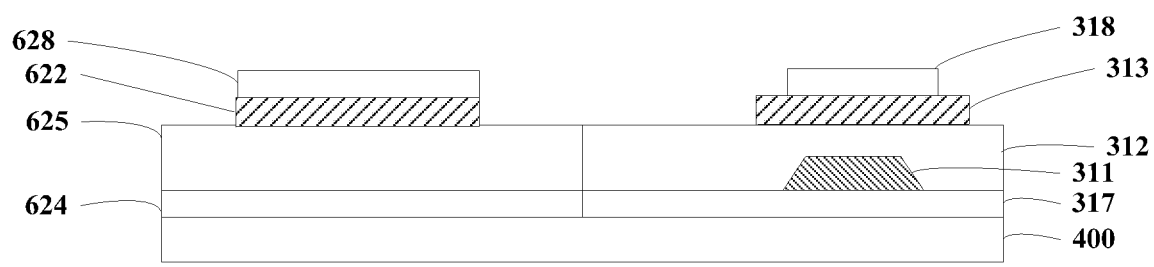
FIG. 14B is a schematic cross-sectional view showing a structure at another stage during a manufacturing process of a display panel according to another embodiment of the present disclosure.

Next, as shown in FIG. 14B, a first protective layer 318 is formed on the first organic semiconductor layer 313, and a third protective layer 628 is formed on the second organic semiconductor layer 622. For example, the third protective layer 628 and the first protective layer 318 are formed by the same patterning process. The two protective layers may protect the first organic semiconductor layer and the second organic semiconductor layer during the process of forming a source and a drain.

Figure 14C:
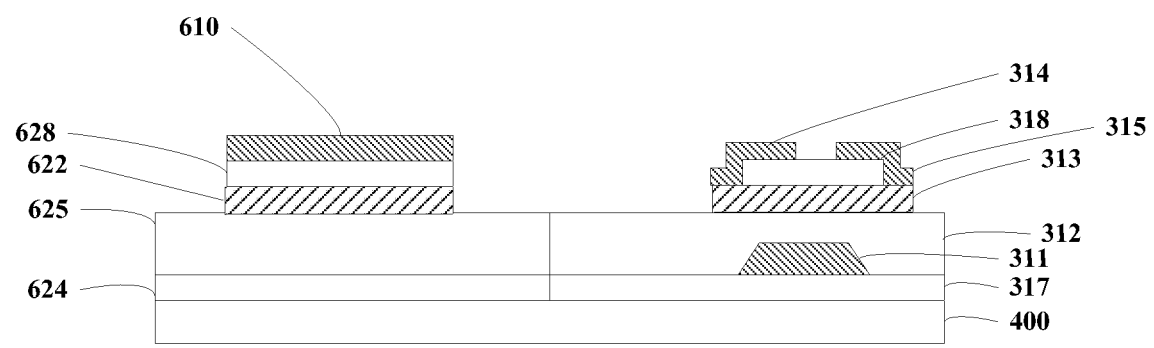
FIG. 14C is a schematic cross-sectional view showing a structure at another stage during a manufacturing process of a display panel according to another embodiment of the present disclosure.

Next, as shown in FIG. 14C, a source 314 and a drain 315 each connected to the first organic semiconductor layer 313 are formed, and a touch electrode layer 610 is formed on the third protective layer 628 (i.e., above the encapsulation layer). The touch electrode layer 610 comprises a first touch electrode 611 and a second touch electrode 612 spaced apart from the first touch electrode 611 (which may refer to FIG. 5). For example, the first touch electrode 611, the second touch electrode 612, the source 314 and the drain 315 are formed by the same patterning process.

Next, as shown in FIG. 8, a third insulating layer 316 is formed on the source 314, the drain 315 and the first protective layer 318, and a sixth insulating layer 626 covering the third protective layer 628 is formed. Here, the sixth insulating layer covers a side surface of the third protective layer 628. The sixth insulating layer also covers the touch electrode layer 610. For example, the sixth insulating layer 626 is formed integrally with the third insulating layer 316.

So far, a manufacturing method of a display panel according to other embodiments of the present disclosure is provided. In the manufacturing method, a touch device may be formed during the process of forming a thin film transistor of an organic photoelectric triode. By integrating the manufacturing processes of the two devices, that is, the manufacturing process of the organic photoelectric triode may be compatible with the FSLOC (Flexible single layer on cell) process, which may facilitate the manufacture of the display panel, thereby saving the manufacturing cost.

FIGS. 14A to 14C and FIG. 8 above describe a manufacturing process of the thin film transistor and the touch device in the case where the first touch electrode and the second touch electrode are both on the same layer as the source and drain. In other embodiments, the first touch electrode, the source, and the drain may be formed by the same patterning process, and the second touch electrode spaced apart from the first touch electrode may be formed after or before the first touch electrode is formed, so that the second touch electrode is formed above or below the first touch electrode.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above-described examples are only for the purpose of illustration and are not intended to limit the scope of the present disclosure. It should be understood by those skilled in the art that modifications to the above-described embodiments and equivalently substitution of portion of the technical features may be made without departing from the scope and spirit of the present disclosure. The scope of the present disclosure is defined by the appended claims.

What is claimed is:

1. A display panel, comprising:
a substrate;
a pixel structure layer on the substrate, wherein the pixel structure layer comprises a plurality of sub-pixels, at least one of which is configured to emit a first light; and
a sensor layer on a side of the pixel structure layer away from the substrate, wherein the sensor layer comprises a photoelectric conversion device configured to receive a second light produced after the first light is reflected by an external object and convert the second light into an electrical signal, wherein the photoelectric conversion device comprises an organic photoelectric triode, the organic photoelectric triode comprising a thin film transistor and an organic photoelectric structure electrically connected to the thin film transistor.

2. The display panel according to claim 1, wherein:
the pixel structure layer further comprises a pixel defining layer;
each of the plurality of sub-pixels comprises a functional layer, wherein functional layers of different sub-pixels are spaced apart by the pixel defining layer; and
an orthographic projection of the photoelectric conversion device on the substrate is inside an orthographic projection of the pixel defining layer on the substrate.

3. The display panel according to claim 2, wherein:
the plurality of sub-pixels comprise a green sub-pixel, and
the photoelectric conversion device is above a pixel defining layer adjacent to the functional layer of the green sub-pixel.

4. The display panel according to claim 1, further comprising an encapsulation layer between the sensor layer and the pixel structure layer, wherein the thin film transistor comprises:
a gate;
a first insulating layer covering the gate;
a first organic semiconductor layer on the first insulating layer;
a first protective layer on the first organic semiconductor layer;
a source and a drain each connected to the first organic semiconductor layer, the source covering a portion of the first protective layer and a portion of the first organic semiconductor layer, and the drain covering another portion of the first protective layer and another portion of the first organic semiconductor layer;
a second insulating layer between the encapsulation layer and the gate; and
a third insulating layer on the source, the drain, and the first protective layer.

5. The display panel of claim 4, wherein the organic photoelectric structure comprises:
   a first electrode layer electrically connected to the source or the drain;
   an organic photoelectric conversion layer on the first electrode layer; and
   a second protective layer on the organic photoelectric conversion layer.

6. The display panel of claim 4, wherein the sensor layer further comprises a touch device, the touch device comprising a touch electrode layer above the encapsulation layer, the touch electrode layer comprising a first touch electrode and a second touch electrode spaced apart from the first touch electrode, wherein:
   the first touch electrode and the second touch electrode are both in a same layer as the gate; or
   the first touch electrode is in a same layer as the gate, and the second touch electrode is above or below the first touch electrode.

7. The display panel according to claim 6, wherein the touch device further comprises:
   a fourth insulating layer on the encapsulation layer, the fourth insulating layer being in a same layer as the second insulating layer;
   a fifth insulating layer on the fourth insulating layer, the fifth insulating layer being in a same layer as the first insulating layer;
   a second organic semiconductor layer on the fifth insulating layer, the second organic semiconductor layer being in a same layer as the first organic semiconductor layer;
   a third protective layer on the second organic semiconductor layer, the third protective layer being in a same layer as the first protective layer; and
   a sixth insulating layer covering the third protective layer, the sixth insulating layer being in a same layer as the third insulating layer.

8. The display panel according to claim 4, wherein the sensor layer further comprises a touch device, the touch device comprising a touch electrode layer above the encapsulation layer, the touch electrode layer comprising a first touch electrode and a second touch electrode spaced apart from the first touch electrode, wherein:
   the first touch electrode and the second touch electrode are both in a same layer as the source and the drain; or
   the first touch electrode is in a same layer as the source and the drain, and the second touch electrode is above or below the first touch electrode.

9. A display device, comprising: the display panel according to claim 1.

10. A manufacturing method of a display panel, comprising:
   forming a pixel structure layer on the substrate, wherein the pixel structure layer comprises a plurality of sub-pixels, at least one of which is configured to emit a first light; and
   forming a sensor layer on a side of the pixel structure layer away from the substrate, wherein the sensor layer comprises a photoelectric conversion device configured to receive a second light produced after the first light is reflected by an external object and convert the second light into an electrical signal, wherein:
   the photoelectric conversion device comprises an organic photoelectric triode, the organic photoelectric triode comprising a thin film transistor and an organic photoelectric structure electrically connected to the thin film transistor;
   the sensor layer further comprises a touch device; and
   the forming of the sensor layer comprises: forming the thin film transistor and the organic photoelectric structure of the organic photoelectric triode, and forming the touch device.

11. The manufacturing method according to claim 10, further comprising forming an encapsulation layer on the pixel structure layer before forming the sensor layer, wherein the photoelectric conversion device is formed on a side of the encapsulation layer away from the pixel structure layer; and
   the forming the thin film transistor of the organic photoelectric triode comprises:
   forming a second insulating layer on the encapsulation layer;
   forming a gate on the second insulating layer;
   forming a first insulating layer covering the gate;
   forming a first organic semiconductor layer on the first insulating layer;
   forming a first protective layer on the first organic semiconductor layer;
   forming a source and a drain each connected to the first organic semiconductor layer, the source covering a portion of the first protective layer and a portion of the first organic semiconductor layer, and the drain covering another portion of the first protective layer and another portion of the first organic semiconductor layer; and
   forming a third insulating layer on the source, the drain, and the first protective layer.

12. The manufacturing method according to claim 11, wherein the forming of the organic photoelectric structure of the organic photoelectric triode comprises:
   forming a first electrode layer electrically connected to the source or the drain;
   forming an organic photoelectric conversion layer on the first electrode layer; and
   forming a second protective layer on the organic photoelectric conversion layer.

13. The manufacturing method according to claim 11, wherein the forming of the touch device comprises forming a touch electrode layer above the encapsulation layer, the touch electrode layer comprising a first touch electrode and a second touch electrode spaced apart from the first touch electrode wherein:
   the first touch electrode, the second touch electrode, and the gate are formed by a same patterning process; or
   the first touch electrode and the gate are formed by a same patterning process, and the second touch electrode is formed above or below the first touch electrode.

14. The manufacturing method according to claim 13, wherein the forming of the touch device further comprises:
   forming a fourth insulating layer on the encapsulation layer, wherein the fourth insulating layer is formed integrally with the second insulating layer;
   forming a fifth insulating layer on the fourth insulating layer, wherein the fifth insulating layer is formed integrally with the first insulating layer;
   forming a second organic semiconductor layer on the fifth insulating layer, wherein the second organic semiconductor layer and the first organic semiconductor layer are formed by a same patterning process;
   forming a third protective layer on the second organic semiconductor layer, wherein the third protective layer and the first protective layer are formed by a same patterning process; and forming a sixth insulating layer covering the third protective layer, wherein the sixth insulating layer is formed integrally with the third insulating layer.

15. The manufacturing method according to claim 11, wherein the forming of the touch device comprises:
    forming a touch electrode layer above the encapsulation layer, the touch electrode layer comprising a first touch electrode and a second touch electrode spaced apart from the first touch electrode, wherein:
    the first touch electrode, the second touch electrode, the source, and the drain are formed by a same patterning process; or
    the first touch electrode, the source, and the drain are formed by a same patterning process, and the second touch electrode is formed above or below the first touch electrode.

* * * * *